United States Patent [19]

Chapron

[11] 4,007,385
[45] Feb. 8, 1977

[54] SERIALLY-CONNECTED CIRCUIT GROUPS FOR INTERGRATED INJECTION LOGIC

[75] Inventor: Claude Chapron, Caen, France

[73] Assignee: U.S. Philips Corporation, New York, N.Y.

[22] Filed: Sept. 11, 1974

[21] Appl. No.: 504,911

[30] Foreign Application Priority Data

Sept. 13, 1973 France .............................. 73.32916

[52] U.S. Cl. .............................. 307/296; 307/213; 307/299 B; 307/303; 357/44; 357/46; 357/48
[51] Int. Cl.² ................. H03K 19/08; H01L 27/02; H01L 27/04
[58] Field of Search ................... 357/35, 36, 40, 44, 357/46, 48; 307/303, 313, 213–215, 299 B, 296

[56] References Cited

UNITED STATES PATENTS

| 3,736,477 | 5/1973 | Berger et al. | 357/40 |
| 3,823,353 | 7/1974 | Berger et al. | 357/36 |

OTHER PUBLICATIONS

Berger et al. "Merged Transistor Logic with Power Driver" IBM Tech. Disclosure Bulletin vol. 15 (10/72).
H. Berger et al. "Merged–Transistor Logic (MTL) –a Low–Cost Bipolar Logic Concept" IEEE J. Solid–State Circuits vol. SC–7 (10/72) p. 340–346.
K. Hart et al. "Integrated Injection Logic: A New Approach to LSI" IEEE J. Solid–State Circuits vol. SC–7 (10/72) p. 346–351.

*Primary Examiner*—William D. Larkins
*Assistant Examiner*—Gene M. Munson
*Attorney, Agent, or Firm*—Frank R. Trifari; Jack Oisher

[57] ABSTRACT

Integrated injection logic circuits are described comprising groups of active transistors having biasing current injectors with the groups arranged in series across a voltage supply and with a signal connection between different groups. This circuit arragement allows efficient use of a higher voltage supply as might be required for other logic circuitry present.

7 Claims, 13 Drawing Figures

SERIALLY-CONNECTED CIRCUIT GROUPS FOR INTERGRATED INJECTION LOGIC

The present invention relates to integrated circuits having transistors which are provided with current injectors, the current injectors having at least a first, a second and a third layer or zone, a collector of a transistor, hereinafter termed controlling transistor, being connected to the base of a controlled transistor.

Such integrated circuits, sometimes referred to as integrated injection logic or I²L circuits, are known from French Pat. application 2,138,905, which corresponds to U.S. Pat. application, Ser. No. 505,663, filed Sept. 10, 1974. They are circuits which comprise inter alia at least a current injector which usually consists of a number of successive semiconductor layers (for example, three or five layers) of alternate conductivity types which constitute several successive rectifying junctions. The first of said junctions is biased in the forward direction so that charge carriers are injected across said junction. Of particular importance in this connection is the flow of charge carriers which consists of the type of charge carriers which constitute the minority in the second layer of the current injector and in the layers of the current injector which have the same conductivity type as the second layer.

The current which is permanently injected in this manner in the structure of such an integrated circuit serves to adjust the operating point of the transistors which the said circuit comprises. Said adjusted operating point may then be varied by applying control signals.

It is known that, due to the use of a current injector structure, the integrated circuits with current injectors operate with very low supply voltages. For example, approximately 0.7 volt for an integrated circuit manufactured from silicon. This facilitates the possibility of making devices with said circuits the power of the supply of which and hence also the dissipated power are very low.

It is furthermore known that a very interesting advantage of said method consists of a large decrease of the number of conductor tracks which is necessary to supply to the transistors used the bias currents which are necessary to adjust the operating points. This facilitates the manufacture and in addition provides a considerable reduction of the semiconductor area required for the circuit.

When logic integrated circuits with current injectors with a supply voltage of approximately 0.7 volt are used together with logic circuits belonging, for example, to the groups of logic circuits which are usually referred to as TTL (transistor-transistor logic) or ECL (emitter-coupled logic) and which usually operate with voltages in the order of 5 volts, inter alia the supply voltages must be adapted and harmonized.

One of the solutions to this problem consists of supplying the I²L circuits used by means of the direct current source of approximately 5 volts which is used for the supply of the other logic circuits, in which a series resistor is used across which a voltage drop of approximately $(5 - 0.7) = 4.3$ volts occurs. This solution is very simple but has the drawback that a power which is approximately 6 times larger than that consumed by the I²L circuit itself is dissipated as a pure loss in the above-mentioned series resistor.

One of the objects of the present invention is to reduce the power used for the supply of integrated logic circuits with current injectors in those cases in which the said integrated circuits are supplied from a direct voltage source which is also used as the supply for logic circuits which require a higher supply voltage than the I²L circuits.

Another object of the invention is to provide a good solution to the supply of I²L circuits by means of a supply source which comprises a supply voltage which is at least a multiple of the minimum supply voltage actually required for I²L circuits and furthermore to indicate how the I²L circuit in question can be adapted to said way of supply.

According to the invention, an integrated circuit having transistors which are provided with current injectors (I²L circuit) in which the current injectors have at least a first, a second and a third layer or zone and in which a collector of a controlling transistor is connected to the base of a controlled transistor, is characterized in that the transistors which are provided with current injectors are distributed between several elementary groups which require substantially the same supply currents and which, as regards the supply, are connected in series so that the groups constitute storeys or stages which are placed or laid out one after the other and across which a distribution of the supply voltage occurs and in which the uppermost or first storey is constituted by the group of transistors having the current injector(s) of which the first layer of the current injector(s) is connected, without the interposition of further storeys, to a supply connection and the lowermost or last storey is formed by the group of transistors with current injector(s) of which the second layer of the current injector(s) is connected, without the interposition of further storeys, to a supply connection and in which a functional connection between a collector of a controlling transistor having a current injector and being associated with a higher storey and a controlled transistor belonging to a lower storey comprises at least an auxiliary transistor the collector of which is connected to the base of the controlled transistor.

The base of the controlled transistor is preferably not further connected to a current injector.

In integrated logic circuits with current injectors, the (switching) speed depends on the current supplied to the transistors by the current injectors. With the desired value of the current is associated a voltage difference across the first rectifying junction of the current injector, which voltage difference is slightly dependent on the temperature of said junction. Therefore, in the supply circuit measures are preferably taken to stabilise and control the current level of the supply current. This can be realized, for example, with a series resistor or a transistor which is connected so as to convey a substantially constant collector current, the simplest solution being the use of a series resistor of a suitable value.

Dependent on the value of the supply voltage supplied by the available supply source, the number of elementary groups is chosen to be so that the overall supply voltage of said elementary, series-arranged groups leaves a sufficient voltage margin for the transistor to operate in normal manner to stabilise the supply current or for the series resistor (ballast resistor) to be sufficiently efficient. When using a single series resistor it should preferably be achieved that with the permitted variations of the specified supply voltage the corresponding variations of the supply current are acceptable.

If the nominal voltage of the direct voltage source used for the supply is, for example, 5 volts, the number of elementary, series-arranged groups may be equal to four or to five dependent on the width of the temperature range in which the operation of the logic integrated circuits with current injectors is to be ensured. The nominal value of the overall supply voltage of the I²L circuit then is 2.8 volts or 3.5 volts and the nominal voltage drop in the ballast resistor or in the control transistor is 2.2 volts or 1.5 volts. In these circumstances the consumed current is one fourth or one fifth of the current which would have been necessary when the elementary groups would be supplied in parallel.

The division of the integrated circuit with current injectors into elementary groups at different supply storeys necessitates functional connections between the various storeys. Functional connections are to be understood to mean herein connections for transferring information-carrying signals, such as logic signals. An important aspect of the invention is that said functional connections between various storeys can simply be realised so that the distribution of the transistors between the elementary groups can take place substantially independently of the function or partial functions of the circuit.

Each elementary group of transistors can be manufactured as an integrated circuit in an individual semiconductor body. The manufacturing process then is particularly simple and substantially equal to that of normal transistors.

The various elementary groups of transistors may also be manufactured in isolated islands in the same semiconductor body.

The semiconductor body preferably comprises at least the same number of isolated islands as there are elementary groups of transistors and the I²L circuit is manufactured entirely in the same semiconductor body. This embodiment has a comparatively high reliability because the connections between the elementary groups can also be constructed in the form of conductor tracks.

In the series arrangement of the elementary groups of transistors it can simply be achieved in the last mentioned embodiment that during operation the potential difference between the isolated island and the substrate of the semiconductor body is such that the desired electric isolation is ensured. This does not require any extra electric connection or extra voltage source.

An integrated auxiliary transistor without an injector is advantageously incorporated in the functional connection between a controlled transistor and a controlling transistor which preferably has a current injector and which belongs to a higher storey than the controlled transistor, said auxiliary transistor being provided in the same storey as the controlling transistor and the type of which (pnp or npn) being complementary to that of the controlling transistor (npn or pnp), the collector of the auxiliary transistor being conductively connected to the base of the said controlled transistor. The emitter of the said auxiliary transistor is preferably connected to the first layer of the current injector(s) of the storey of the controlling transistor and the base of the auxiliary transistor is conductively connected to a collector of the controlling transistor. The base of the controlled transistor receives no bias current from the current injector(s) of its lower situated storey.

In an important preferred embodiment of the integrated circuit according to the invention, two auxiliary transistors are incorporated in a functional connection between a controlled transistor and a controlling transistor which preferably has a current injector and which is associated with a higher storey than the controlled transistor, which auxiliary transistors are both of the type (pnp or npn) which is complementary to that of the controlling and the controlled transistors (npn or pnp), the auxiliary transistors being integrated in the same storey as the controlling transistor and being series arranged. The emitter of a first of the auxiliary transistors is connected to the first layer of the current injector(s) of said higher storey and the base of the first auxiliary transistor is connected to the second layer of the current injector(s) of said higher storey, the collector of the first auxiliary transistor and the emitter of the second auxiliary transistor having a common semiconductor zone which is conductively connected to a collector of the controlling transistor, the collector of the second auxiliary transistor being conductively connected to the base of the controlled transistor. The base of the second auxiliary transistor may also be associated with the second layer of the current injector(s) of the higher storey, so that no separate isolated island in said higher storey is necessary for the auxiliary transistors. In this case also the base of the controlled transistor is not connected to the current injector(s) of its lower situated storey. The two auxiliary transistors may together be considered as a current injector for the controlled transistor. Said current injector corresponds to the controlled five-layer current injector described in the previously mentioned French Pat. application No. 2,138,905. The functional connection may also comprise more, for example three or four, series-arranged auxiliary transistors which together constitute a structure which corresponds to a current injector which is built up from seven and nine layers, respectively.

In addition to connections for transferring information from a higher to a lower storey, connections are also desired for transferring information-carrying signals from a lower to a higher storey. In the integrated circuit according to the invention, the last-mentioned connections preferably consist of a direct conductive connection between a collector of a controlling transistor belonging to a lower storey and the base of which preferably has a current injector and the base of a controlled transistor belonging to a higher storey, the base of said controlled transistor being connected to a current injector of the said higher storey.

The invention will now be described in greater detail with reference to a few embodiments and the accompanying drawing.

FIG. 5 is a diagrammatic plan view of a part of an integrated circuit according to the invention which comprises the controlling transistor and the auxiliary transistor of the diagram shown in FIG. 4, in which

FIG. 8 is a diagrammatic plan view of a part of an integrated circuit according to the invention comprising the controlled transistor of the diagram shown in FIG. 5, in which

FIG. 11 is a diagrammatic plan view of a part of an integrated circuit comprising the controlling transistor and the two auxiliary transistors of the diagram shown in FIG. 10, in which FIG. 12 is an associated diagrammatic sectional view taken on line XII—XII of FIG. 11.

Figure 1:
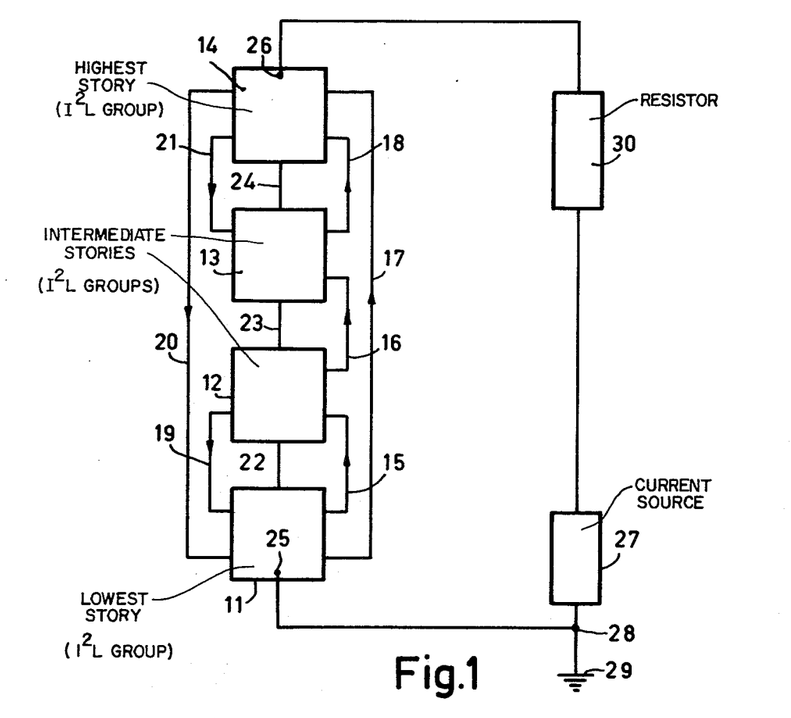
FIG. 1 shows a block diagram which illustrates the division of an I²L circuit into groups of transistors.

FIG. 1 shows a block diagram of an integrated logic circuit with current injectors which consists of four elementary groups of circuits denoted by reference numerals 11, 12, 13, 14.

Between the elementary groups 11, 12, 13 and 14 are shown the connections 22, 23, 24 which denote the series arrangement of the said elementary groups as regards the supply current.

As a result of this, the outermost terminals 25 and 26 which belong to the elementary groups 11 and 14, respectively, constitute the supply terminals of the assembly which consists of the four above-mentioned elementary groups.

In the example of FIG. 1 a supply source 27 is provided whose terminal 28 is connected to a point of reference potential, for example, ground 29 or the mass of the device.

The terminal 25 of the elementary group 11 is directly connected to the terminal 28 of the source 27 and the terminal 26 is connected to the other terminal of the source 27 via an element 30 for stabilizing or restricting the current level of the current supplied by the source 27. The element 30 may consist, for example, of a resistor having a suitable value or, for example, may be formed in known manner by a transistor which is biased so that its collector-emitter current is substantially constant.

The four elementary groups 11, 12, 13 and 14 constitute four storeys or stages between which the supply voltage available between the terminals 25 and 26 is distributed substantially uniformly. The voltages which occur across the supply connections of each storey or stage individually are substantially the same for all the storeys.

In FIG. 1 it has been assumed that the terminal 26 is connected to the first layer of the current injector or current injectors of the elementary group 14 and that the said group thus forms the uppermost or first storey of the groups 11-14, and the group 11 forms the lowermost or last storey of the groups 11-14.

The distribution of the components - formed for example, by smaller base circuits or circuit elements - between the elementary groups is independent of the function, in this case the signal processing of the integrated circuit. This means that the distribution of the components between the elementary groups need not go hand in hand with or adjoin a possible functional distribution - a distribution of partial functions - of the integrated circuits. The information or signal processing in the various elementary groups need, for example, not necessarily be effected parallel or in sequence after each other. In connection herewith it should be practically possible to transfer from a comparatively arbitrarily chosen point in one of the storeys an information-carrying signal to a point in another storey via a conductive connection for further processsing or, for example, for being combined there with other information-carrying signals. This is denoted in FIG. 1 by a number of communication lines 15 to 21 inclusive each provided with an arrow which denotes the direction of the information flow. So within the scope of the present invention there is distinguished between on the one hand supply lines and on the other hand functional or communication lines. Both types of lines are conductive connections, one type serving for the supply of supply current and/or supply voltage, and the other type for transferring electric signals with information contents.

Figure 2:
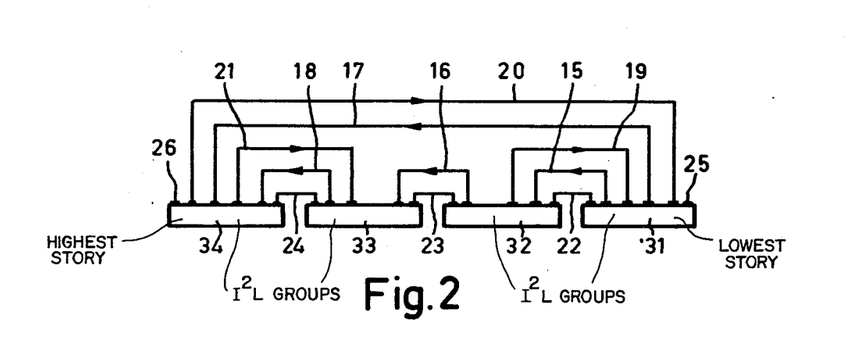
FIG. 2 shows diagrammatically an example in which the groups of transistors are each provided in a separate semiconductor body.

In the example shown in FIG. 2 the elementary groups of circuits 11, 12, 13 and 14 shown in FIG. 1 have been realised in the semiconductor chips 31, 32, 33 and 34, respectively. The connections 22, 23 and 24 are supply lines by which the various storeys are connected in series. For that purpose the semiconductor bodies 31, 32, 33 and 34 have, for example, suitable conductive surfaces to which conductors can be connected, for example, by thermocompression or ultrasonic welding. The functional connections or communication lines between the elementary groups comprise at least one conductor which in the present case is also formed by a wire connection. In FIG. 2 the same reference numerals are used to denote the functional connections as in FIG. 1, in which the direction of the flow of information is denoted in a corresponding manner by means of arrows.

In another embodiment (FIG. 3) the elementary groups are provided in four isolated islands 35, 36, 37 and 38 in the same semiconductor body. This semiconductor body is, for example, of silicon and may consist of a p-type substrate 39 on which an n-type epitaxial layer 40 is provided which is subdivided in known manner by providing deep p-type regions 41, 42, 43, 44 and 45 into a number of parts which are isolated from each other and from the substrate 39 by p-n junctions. Each of the isolated parts or islands 35, 36, 37 and 38 has an n-type buried layer which is more highly doped than the overlying part of the epitaxial layer 40, in which moreover more highly doped n-type regions are provided in each island and extend from the surface down to or in the buried layer. Such highly doped n-type regions are present at least along the whole edge of the island in question.

Figure 3:
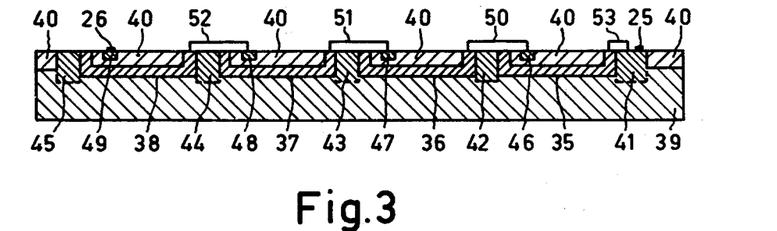
FIG. 3 shows diagrammatically an embodiment in which the groups of transistors are each provided in an isolated island of a common semiconductor body.

Circuit elements which have a current injector are present in each of the islands. This is shown diagrammatically by means of the p-type zones 46, 47, 48 and 49 which each represent the first or injecting layer (or layers) of the current injector(s) used in the island in question.

A conductive connection 50 between the more highly doped edge of the isolated island 36 and the first layer 46 of the current injector(s) of the isolated island 35 is shown diagrammatically. Likewise, a conductor 51 connects the more highly doped edge of the isolated island 37 to the first layer 47 of the current injector(s) of the isolated island 36, while the conductor 52 constitutes the connection between the more highly doped edge of the isolated island 38 and the first layer 48 of the current injector(s) of the isolated island 37. A conductive connection 53 is furthermore provided between the more highly doped edge of the isolated island 35 and the deep p-type region 41. The conductive connections 50, 51, 52 and 53 may consist, for example, of aluminum tracks which are provided in the usual manner on an insulating layer of, for example, silicon dioxide present on the semiconductor body and which form ohmic contacts with the said p- and n-type regions in apertures in the insulating layer. The first layer 49 of the current injector(s) of the island 38 and the p-type region 41 connected to the island 35 have terminals 25 and 26, respectively, for example, in the form of conductor tracks which have a connection surface for connecting conductors by thermocompression or ultrasonic welding.

The input(s) for the supply of information to the subdivided integrated circuit realised in the isolated islands 35, 36, 37 and 38, as well as the output(s) from which the information-carrying signals generated by said circuits can be derived are not shown in FIG. 3 for clarity. For the same reason, a more detailed description of the I²L circuit itself is not incorporated either. For such a detailed description reference is made to the above-mentioned French Pat. application No. 2,138,905.

The voltage applied across the isolating p-n junction of the island 35 is zero because said island is connected by the conductor 53 to the p-type region 41 and hence also the substrate 39. The p-n junctions which isolate the islands 36, 37 and 38 are then automatically biased in the reverse direction as a result of the positive voltages of approximately 0.7 volts, approximately 1.4 volts and approximately 2.1 volts, respectively, which for said islands result from the distribution of the overall supply voltage between the various storeys.

Starting from the forward direction of the first rectifying junction of the current injectors which are shown diagrammatically in FIG. 3, the negative polarity will be presented to the terminal 25 and the positive polarity of the supply will be presented to the terminal 26.

The conductivity types given in this example and in the examples still to be described are meant only by way of example and they may simply be changed if the polarities of the applied voltages are also reversed.

The preceding examples show that the elementary groups can be arranged in series with a supply source in a comparatively simple manner in the form of storeys. As a result of the series arrangement, however, a difference in direct voltage level will occur between the information-carrying signals in various storeys. This direct voltage difference may form a restriction for the functional communication between the various storeys. The practical attractiveness of the subdivision into storeys of the integrated circuit is also determined by the practical consequences of the said direct voltage difference. Of importance is in how far an information-carrying signal available in the integrated circuit in a given storey is directly suitable or can at least simply be adapted to control therewith a part of the circuit present in another storey.

Consequently, an important aspect of the invention is to indicate how the communication between the various storeys, so the transfer of information from one storey to the other, can be realised.

It may be assumed that it is known from the already mentioned French Pat. application No. 2,138,905 that I²L circuits are substantially entirely constructed from transistors in common emitter arrangement, each base being connected to a current injector. Input signals are always presented to a base of a transistor, while output signals are derived from the collector(s) of said transistor. Many multi-collector transistors are used particularly in logic circuits. The current injectors have at least two rectifying junctions, the supply voltage being equal to the voltage which is necessary to bias the first rectifying junction of the current injector in the forward direction.

Figure 4:
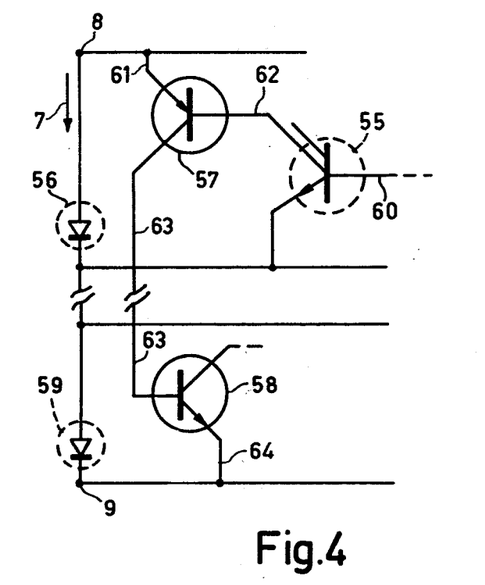
FIG. 4 shows in an electric circuit diagram how functional connections between a controlling transistor belonging to a higher storey and a controlled transistor belonging to a lower storey, can be realised for example, by means of an auxiliary transistor.

In the diagram of FIG. 4 is shown an npn transistor 55 which has a current injector, the current injector being represented diagrammatically by a diode 56. The transistor 55 has two collectors, so two signal outputs, one of which is connected to the signal input, that is to say the base, of an npn transistor 58 present in another storey. An information-carrying signal available at the or one of the collectors of the transistor 58 may serve directly for controlling (not-shown) further npn transistors having a current injector and present in said storey. The current injector(s) of said storey is (are) represented by the diode 59. The storeys corresponding to the shown diodes 56 and 59 in the series arrangement between the supply connections may be both adjoining storeys and storeys which are separated from each other by intermediate storeys. In the injector diodes 56, 59, the anodes correspond to the aforementioned first layer of zone, and the cathodes correspond to the second layer or zone. As will be shown later, the third layer or zone would usually be the base zone of the transistor it biases, thus, for the higher storey, the base zone of transistor 55.

An auxiliary transistor 61 of the complementary type, so in this case a pnp transistor, is incorporated in the connection between the npn transistors 55 and 58.

The emitter of the npn transistor 55 is connected electrically to and has the same potential as the n-type region of the diode 56. The potential of the base zone of said transistor depends on the further part of the I²L circuit connected thereto. The base 60 may be considered as a signal input. One of the collectors of transistor 55 is connected to the base of the pnp auxiliary transistor 57 by a conductor 62. It is denoted by a connection 61 that the emitter of said auxiliary transistor has the same potential as the p-type region of the diode 56. The collector of the auxiliary transistor 57 is connected by means of a conductor 63 to the base or signal input of the npn transistor 58 present in a lower storey, while the connection 64 denotes that the emitter of said npn transistor 58 has the same potential as the n-type region of the diode 59 and hence of the emitters of substantially all npn transistors of said storey having a current injector.

It is to be noted that as used herein within the scope of the invention, the highest or first storey is always to be understood to mean that storey of which the first layer of the current injector(s) is connected to the supply source without the interconnection of further storeys. In the present example the highest storey is the storey in which the most positive potentials occur. However, when the conductivity types are reversed and the voltage polarities are reversed, the most negative potentials occur in the highest storey. The lowest or last storey is to be understood to mean the storey at the end of the serial line opposite to that of the first storey. A high storey shall mean a storey located closer in the series connection to the beginning. A lower storey shall mean a storey located further away from the beginning in the serial line. The use of these terms considerably simplifies the description and claims appearing hereinafter.

The npn transistor 58 may be entirely equal to the further npn transistors of said storey. The base of transistor 58 only does not have a current injector. The auxiliary transistor 57 has no current injector either.

As regards the supply, the circuit shown in FIG. 4 may be considered as having two supply terminals: a negative terminal 9 connected to the second layer or cathode of the current injector which is shown by the diode 59 and a positive terminal 8 connected to the first layer or anode of the current injector which is represented by the diode 56.

As a result of the supply current which is supplied and which flows from the terminal 8 to the terminal 9, a voltage in the order of 0.7 volt occurs between the terminals of each of the storeys, that is to say in this case across each of the diodes 56 and 59. In view of the forward direction of the current injectors, the direction of flow of the supply current is as is denoted by the arrow 7.

The operation of the circuit shown in FIG. 4 may be explained as follows.

When the base 60 of the npn transistor 55 which, in order to distinguish it from the npn transistor 58, may be referred to as the controlling transistor, has been brought at a potential which is equal to or at least adjacent that of the potential of the emitter of said transistor 55, transistor 55 is in the cut-off or non-conductive state. Because the transistor 55 is cut off, no base current is available for the pnp auxiliary transistor 57 so that said transistor is also non-conductive. As a result of this, the npn transistor 58 receives no base current so that said transistor 58, the controlled transistor, is also non-conductive.

However, when the base 60 of the transistor 55 is brought at a potential which is sufficiently positive to open the emitter-base junction so that injection of charge carriers occurs and said transistor 55 changes to the conductive state, the transistors 57 and 58 also become conductive.

Figure 5:
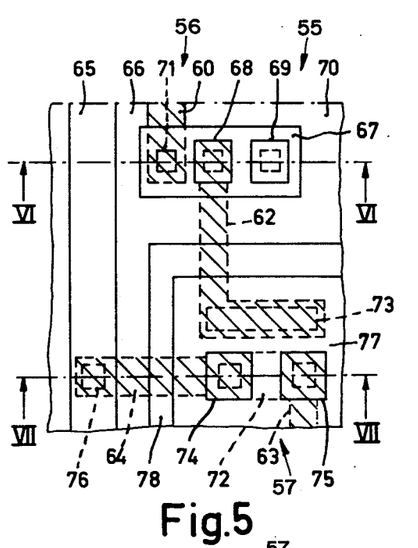
Figure 6:
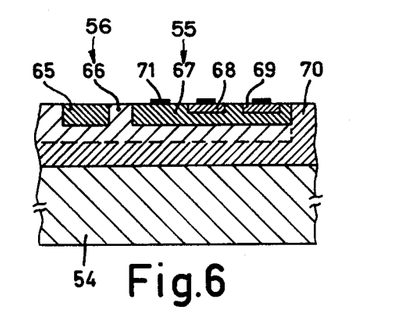
FIGS. 6 and 7 are diagrammatic cross-sectional views of said part of the integrated circuit taken on the line VI—VI and VII—VII, respectively, shown in FIG. 3.
Figure 7:
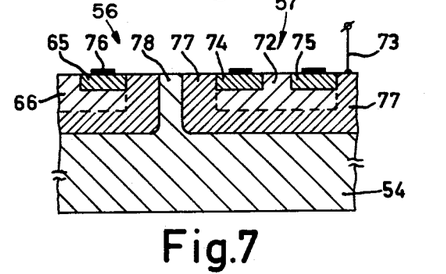

It is shown in FIGS. 5, 6 and 7 how the part of the circuit shown in FIG. 4 which is situated in the same storey together with the controlling transistor 55 can be realised, for example, in a semiconductor body. The semiconductor body has a substrate 54 of p-type silicon. The controlling npn transistor 55 which has a current injector is shown in the upper part of FIG. 5. The first layer or zone of the current injector is a p-type layer 65, the second layer or zone of the current injector is an n-type layer 66, and the third layer or zone of the current injector is a p-type layer 67. Two n-type regions 68 and 69 which constitute the two collectors of controlling transistor 55 are provided in the layer 67. The p-type layer 67 constitutes the base zone of the npn transistor 55, which base zone 67 is substantially entirely enclosed by a region 70 which is n-type doped.

The region 70 belongs to the second layer 66 of the current injector and has a higher doping concentration than the remaining parts of the layer 66. The p-type zone 67 which forms the base of the npn transistor 55 has a base contact 71 to which a conductor track 60 adjoins. The collector zones 68 and 69 each have a collector contact, a conductor track 62 being connected to the collector zone 68.

Figure 8:
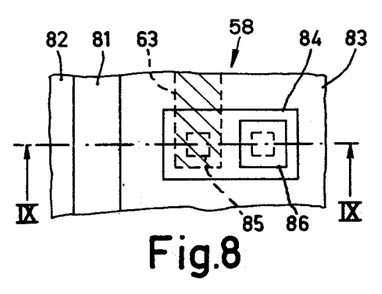

The lowermost part of FIG. 5 relates to the pnp auxiliary transistor 57 without an injector. The transistor 57 is provided in an n-type region 72 which is enclosed by a more highly doped n-type region 77. The n-type region 72, 77 constitutes the base of the pnp transistor and has a base contact 73 and two p-type doped zones; the zone 74 which has a contact and which constitutes the emitter of the transistor 57 and the zone 75 which also has a contact and which constitutes the collector of the transistor 57. A p-type region 78 separates the base 72, 77 from the n-type second layer 66 of the injector of said storey. The first layer 65 of said current injector has a contact 76 and a conductor track 64 connects said first layer 65 to the emitter zone 74 of the pnp transistor. The above mentioned conductor track 62 which comes from the collector 68 adjoins the base contact 73. A conductive track 63 is present between the collector 75 of the pnp transistor and the base of the controlled npn transistor 58 which is shown in FIG. 8.

The npn controlled transistor 58 without an injector is present in a storey of which substantially all transistors have a current injector.

On the storey in question the first layer or zone of the current injector is a p-type layer 81 and the second layer or zone of the current injector is an n-type layer 82. The third layer or zone is not shown. A more highly doped n-type region 83 in the form of a cup is provided in the n-type layer 82. A p-type zone 84 is present within said cup. The zone 84 constitutes the base of the transistor 58 and has a base contact 85. The already mentioned conductor track 63 adjoins said contact. An n-type collector zone 86 which also has a contact is provided within the p-type zone 84. The n-type region 82, 83 which constitutes the emitter zone of the transistor 58 has an electric connection 88 which is shown diagrammatically.

Figure 9:
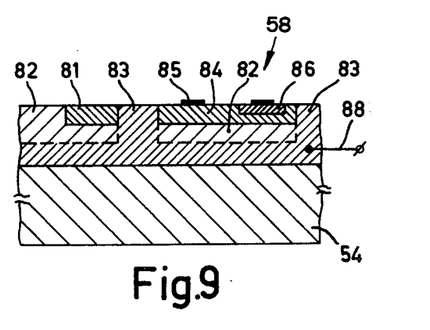
FIG. 9 is an associated diagrammatic cross-sectional view taken on the line IX—IX of FIG. 8.

In FIGS. 6, 7 and 9 the conventional insulating layer and the conductor tracks provided thereon which are present on the semiconductor surface are not shown for clarity.

Figure 10:
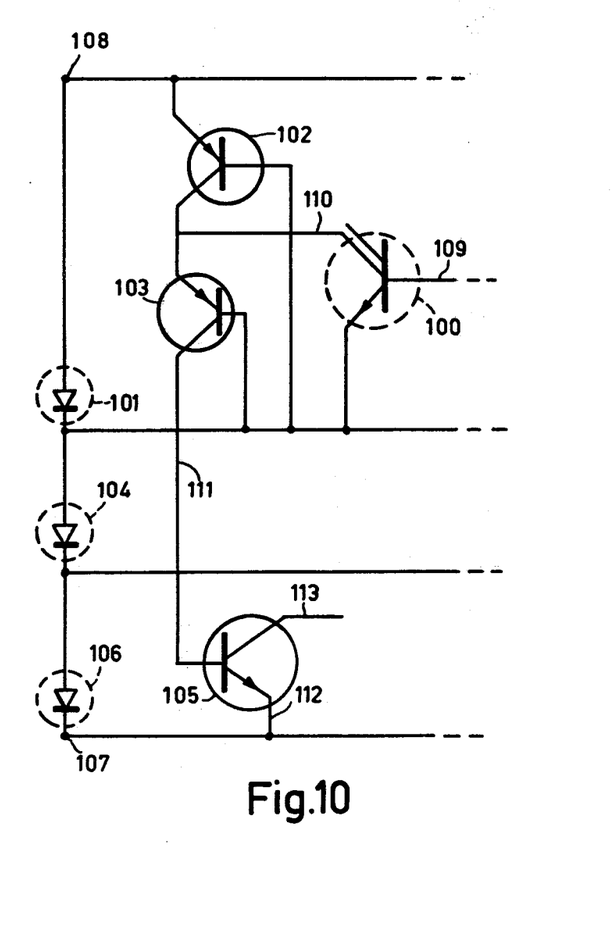
FIG. 10 shows a diagram in which another functional connection is shown between a controlling transistor of a higher storey and a controlled transistor of a lower storey.

The diagram shown in FIG. 10 shows an npn transistor 100 with current injector which is incorporated in a storey the current injector(s) of which is (are) shown diagrammatically by means of a p-n diode 101. Two pnp auxiliary transistors 102 and 103 are arranged in series in the same storey. In the practical realisation, said transistors are situated preferably in the proximity of the npn transistor 100. The npn transistor 100 is the controlling transistor.

A storey present immediately below the storey of the transistors 100, 102 and 103 is shown diagrammatically by a current injector diode 104.

An npn transistor 105 without an injector is present on a storey immediately below that denoted by current injector diode 104. Said storey is denoted by a current injector diode 106. The transistor 105 is the controlled transistor whose operating condition is determined by that of the controlling transistor 100.

In this embodiment the storey with the controlled transistor 105 is separated from the storey with the control transistor 100 by the storey represented by the injector diode 104. However, the operation of the circuit shown is independent of the number of intermediate storeys which number may also be zero, if desired.

As supply terminals of the circuit may be considered a negative terminal 107 which is connected to the second n-type layer or zone of the current injector 106 and a positive terminal 108 which is connected to the first p-type layer or zone of the current injector 101, respectively.

The emitter of the npn transistor 100 having a current injector coincides with the n-type region of the diode 101 which constitutes the second layer of the current injector. The potential of the base region of the transistor 100 depends on a signal source not shown via a conductor 109. The conductor 109 may be considered as a signal input and be connected, for example, to a collector of another transistor of said storey.

The emitter of the pnp auxiliary transistor 102 may be formed by a part of the first layer of the current injector which is shown diagrammatically by the diode 101. Said emitter has the same potential as the terminal 108.

The base of the pnp auxiliary transistor 102 may be formed by a part of the second layer of the current injector and has at least the same potential as the cathode of the diode 101.

The collector diode of the pnp auxiliary transistor 102 and the emitter region of the pnp auxiliary transistor 103 may be formed by the same p-type zone. A conductor 110 connects said zone to (one of) the collector(s) of the controlling npn transistor 100.

The base of the pnp auxiliary transistor 103 is connected to the cathode of the diode 101 and may be formed by a part of the same n-type region which forms the base of the auxiliary transistor 102.

The collector of the pnp auxiliary transistor 103 may be a p-type zone which has an electric contact which is connected, by a conductor 114, to the base of the npn transistor 105 which constitutes the controlled transistor.

The emitter of the npn transistor 105 has the same potential as the second layer of the current injector(s) of said storey. This is indicated by a connection 112 to the cathode of diode 106 and the negative supply terminal 107.

The operation of the circuit shown in FIG. 10 may be described as follows. The pnp auxiliary transistor 102 whose base is at the same potential as the cathode of the diode 101 is always in the conductive state. When the npn transistor 100 is cut off, the collector current of the pnp auxiliary transistor 102 is supplied to the pnp auxiliary transistor 103 which is then also conductive. The collector current of the transistor 103 is available as a base current for the controlled npn transistor 105. As a result of this the transistor 105 which does not have a current injector of its own will also be conductive.

When the controlling npn transistor 100 becomes conductive, the potential of the conductor 110 drops substantially to that of the cathode of the diode 101. The collector current of the pnp auxiliary transistor 102 then flows away through the npn transistor 100, the emitter base junction of the pnp auxiliary transistor 103 being no longer conductive and no charge carriers being injected any longer across said junction because the potential difference between the base and the emitter is reduced substantially to the value zero.

From this it follows that the pnp auxiliary transistor 103 changes to the non-conductive state, the controlled transistor 105 being also cut off.

It is to be noted that the circuit of FIG. 4 and the circuit of FIG. 10 are complementary in that sense that in a given operating condition of the controlling transistor the operating conditions of the relevant controlled transistor are opposite.

Figures 11, 12:
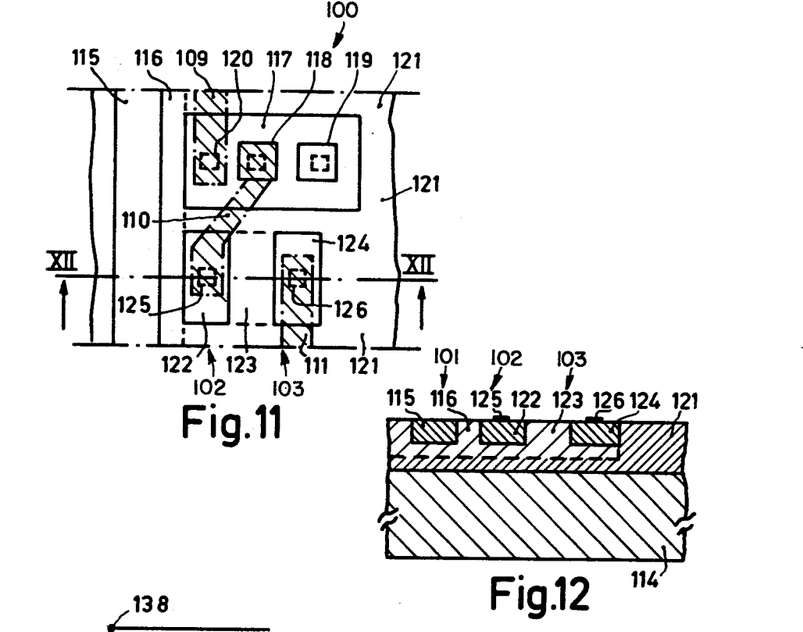

It is shown in FIGS. 11 and 12 how the part of the circuit shown in FIG. 10 present on the storey of the controlling transistor 100 can be realised in an integrated semiconductor circuit. The semiconductor body has a substrate 114, for example, of p-type silicon.

The structure of the controlling transistor 100 which has a current injector is equal to that of the controlling transistor 55 of FIG. 5.

The first layer or zone of the current injector is a p-type layer 115; the second layer or zone of the current injector is an n-type layer 116. The third layer or zone of the current injector which also constitutes the base of the controlling transistor 100, is a p-type layer 117. The two n-type regions 118 and 119 which constitute the collectors of the npn transistor 100 are provided in the p-type base zone 117. The base 117 furthermore has a base contact 120. A more highly doped n-type region 121 which is connected to the negative supply current of the storey in which the transistor 100 is present surrounds the base zone 117 substantially entirely.

A conductor track 109 is connected to the base contact 120 and the collector 118 is connected to a conductor track 110.

The lowermost part of FIG. 11 relates to the two pnp auxiliary transistors 102 and 103.

The emitter region of the auxiliary transistor 102 consists of the part of the p-type layer 115 which is present opposite to the p-type zone having reference numeral 122. The region which constitutes the base of the auxiliary transistor 102 consists of the part of the n-type layer 116 which adjoins the p-type zones 115 and 122.

The p-type zone 122 simultaneously forms the collector of the auxiliary transistor 102 and the emitter of the auxiliary transistor 103. Said zone 122 has a connection 125 and is connected, by means of a conductor track 110, to the collector 118 of the controlling transistor 100.

The region which forms the base of the auxiliary transistor 103 is an n-type region 123 which is present between the zones 122 and 124. The zone 124 is a p-type zone which constitutes the collector of the auxiliary transistor 103. Said zone has a contact 126 and is connected, by means of a conductor track 111, to the base of the controlled transistor 105.

The n-type region 121 comprises a part which is in the form of a buried layer and edges which extend from the buried layer up to the semiconductor surface and which have been obtained, for example, by diffusion. Said edges, which have a high conductivity serve in particular to prevent undesired interaction between the various npn transistors present in the same storey.

The structure of the controlled npn transistor 105 may be entirely equal to that of the transistor 58 described with reference to FIGS. 8 and 9.

Figure 13:
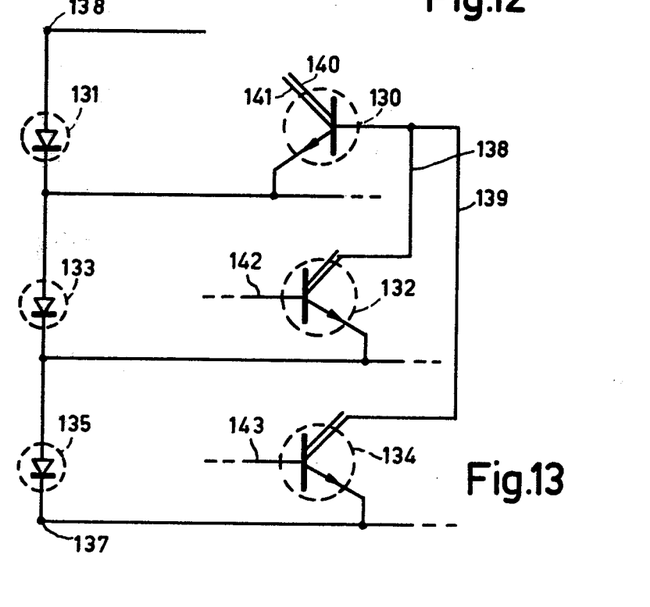
FIG. 13 shows a diagram of an example of functional connections between controlling transistors of a lower storey and a controlled transistor which belongs to a higher storey.

The examples shown in FIGS. 4 and 10 relate to the connection of a collector of a controlling transistor present in a higher storey to the base of a controlled transistor present in an arbitrarily chosen lower storey. FIG. 13 shows an example of a connection between the collector of a lower controlling transistor to the base of a higher controlled transistor. It is an I²L circuit having three storeys the current injector(s) of which are represented by the diodes 131, 133 and 135, respectively. The highest storey comprises a controlled npn transistor 130 while controlling npn transistors 132 and 134, respectively, are present in each of the two lower storeys.

The supply terminals of the circuit are formed by a negative terminal 137 which is connected to the second n-type layer of the current injector(s) of the lowest storey and a positive terminal 138 which is connected to the first layer of the current injector(s) of the uppermost or first storey. The terminals 137 and 138 are thus connected to the cathode of the diode 135 and the anode of the diode 131, respectively.

The transistors 130, 132 and 134 each have a current injector, the emitters of said transistors coinciding with the second layer or zone of the current injectors of the storey in question. This is denoted by connections between the emitters of the transistors 130, 132, 134 and the cathode of the diode 131 and the diodes 133 and 135, respectively. The bases of the transistors would be common with the third layer or zone of their associated biasing current injector.

The base of the npn transistor 130 is connected, by means of a conductor 138, to a collector to the controlling npn transistor 132 and, by means of a conductor 139, to a collector of the controlling npn transistor 134. By means of the conductors 140 and 141, the collector or the collectors of the controlled npn transistor 130 are connected, for example, to a further part of the circuit (not shown) or to an electric output (not shown).

As will be obvious already from the preceding examples, the emitter of the controlling npn transistor 132 is connected to the cathode of the diode 133 and the emitter of the controlling npn transistor 134 is connected to the cathode of the diode 135.

The potential of the base of the transistor 132 depends, via a conductor 142, on a signal source (not shown) for example, a signal input or one or more interconnected collectors of other transistors of the same storey. The base of the controlling npn transistor 134 is controlled in a corresponding manner in the lowest storey via the connection 143.

The circuit shown in FIG. 13 simply operates as follows. When no control voltage at all is applied to the base of the controlled transistor 130, said transistor which has a current injector is conductive. The two transistors 132 and 134 should therefore be non-conductive or cut off. When one of the two controlling transistors becomes conductive, the base of the transistor 130 thus becomes negative with respect to the emitter so that the controlled transistor 130 becomes non-conductive. The examples given of providing functional connections are not exhaustive. The various described connections may be combined in a single integrated circuit. In general it is possible to make several functional connections to coincide on the base of the controlled transistor so that logic combinations of information are obtained. When the controlled transistor is present in the lower of the storeys in question, no problems will occur. When the controlled transistor is present in the higher storey, it may be desirable in the case of controlling transistors which are present in different storeys, as shown at 132 and 134 in FIG. 13, to connect for each storey separately the collector(s) of the controlling transistor(s) of said each storey to the base of a controlled transistor, and to generate possibly desired logic combinations of information-carrying signals originating from different storeys having controlling transistors by connecting together the collectors of different controlled transistors present on an intermediate storey. This will prevent, for example, the transistor 132 shown in FIG. 13 from becoming conductive in an inverse direction, so with the collector serving as emitter, by a direct connection to a conductive controlling transistor 134 present on a lower storey.

In practice there is no problem in obtaining substantially the same supply currents for the various elementary groups of the integrated I²L circuits. The supply current necessary for a given group cannot only be adapted by suitable choice of the number of transistors having a current injector, but can also be influenced by adapting the geometry to the current level of one or more transistors of the relevant storey.

What is claimed is:
1. An integrated injection logic circuit comprising controlling and controlled transistors having bases and collectors and connected to at least some of said transistors to bias same associated biasing current injectors each having at least first, second and third zones with the first and second zones forming a first rectifying junction and the second and third zones forming a second rectifying junction, means connecting the controlling transistor collectors to the controlled transistor bases, the transistors and associated current injectors forming plural elementary groups which require substantially the same supply current and each with a current injector, two terminals for connection to a current supply source, means connecting the plural groups in series across the two terminals for the current supply source so as to include a first in the series defined as the highest storey, a last in the series defined as the lowest storey, higher and lower stories being defined as the higher storey being closer in the series to the beginning than a lower storey, said series connecting means including means connecting the current injector first zone of the group of transistors in the highest storey, without the interconnection of further storeys, to a supply source terminal for biasing the first rectifying junction in the forward direction, means connecting the current injector second zone of the group of transistors in said lowest storey, without the interposition of further storeys, to the other supply source terminal, means connecting the current injector second zone of the highest storey to the current injector first zone of the next lower storey, and means providing a signal connection between a controlling transistor collector of a higher storey and a controlled transistor base of a lower storey, said means providing said signal connection including an auxiliary transistor having emitter, base and collector, means connecting the auxiliary transistor collector to the controlled transistor base, means connecting the auxiliary transistor emitter to the current injector first zone of said higher storey, and means connecting the auxiliary transistor base to the controlling transistor collector.

2. An integrated injection logic circuit as claimed in claim 1 wherein an additional signal connection is provided between a controlling transistor located in a lower storey and a controlled transistor located in a higher storey.

3. An integrated injection logic circuit comprising controlling and controlled transistors having bases and collectors and connected to at least some of said transistors to bias same associated biasing current injectors each having at least first, second and third zones with the first and second zones forming a first rectifying junction and the second and third zones forming a second rectifying junction, means connecting the controlling transistor collectors to the controlled transistor bases, the transistors and associated current injectors forming plural elementary groups which require substantially the same supply current and each with a current injector, two terminals for connection to a current supply source, means connecting the plural groups in series across the two terminals for the current supply source so as to include a first in the series defined as the highest storey, a last in the series defined as the lowest storey, higher and lower stories being defined as the higher storey being closer in the series to the beginning than a lower storey, said series connecting means including means connecting the current injector first zone of the group of transistors in the highest storey, without the interconnection of further storeys, to a supply source terminal for biasing the first rectifying junction in the forward direction, means connecting the current injector second zone of the group of transistors in said lowest storey, without the interposition of further storeys, to the other supply source terminal, means connecting the current injector second zone of the highest storey to the current injector first zone of the next lower storey, and means providing a signal connection between a controlling transistor collector of a higher storey and a controlled transistor base of a lower storey, said signal connection means comprising a signal-controlled current source means separate from the current injectors associated with said higher and lower storeys for actuating said controlled transistor to which it is connected by supplying base drive current thereto and including a transistor of a type complementary to said controlling and controlled transistors, said controlled transistor base to which said signal connection is provided being free of any other current source drive capable of actuating said controlled transistor in the absence of current flow along said signal connection.

4. An integrated injection logic circuit as claimed in claim 3 wherein the elementary groups of transistors are each located in an isolated island of a common semiconductor body.

5. An integrated injection logic circuit as claimed in claim 3 wherein the controlling transistor is connected to the said actuating current source for the controlled transistor in such manner that said actuating current source becomes conductive when said controlling transistor is conductive.

6. An integrated injection logic circuit as claimed in claim 3 wherein the controlling transistor is connected to the said actuating current source for the controlled transistor in such manner that said actuating current source become conductive when said controlling transistor is non-conductive.

7. An integrated injection logic circuit as claimed in claim 3, wherein said signal connection means comprises first and second auxiliary transistors of a type complementary to that of said controlling and controlled transistors and being located in said higher storey and each having emitter, base and collector, the first auxiliary transistor emitter being connected to the current injector first zone of said higher storey, the first auxiliary transistor collector and second auxiliary transistor emitter being connected to the controlling transistor collector, the second auxiliary transistor collector being coupled to the base of said controlled transistor in said lower storey, and both auxiliary transistor bases being connected to the current injector second zone of said higher storey.

* * * * *